(12) United States Patent
Takahashi et al.

(10) Patent No.: US 7,773,425 B2
(45) Date of Patent: Aug. 10, 2010

(54) NONVOLATILE SEMICONDUCTOR MEMORY, METHOD FOR READING THE SAME, AND MICROPROCESSOR

(75) Inventors: Motoi Takahashi, Kawasaki (JP); Ikuto Fukuoka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/905,225

(22) Filed: Sep. 28, 2007

(65) Prior Publication Data
US 2008/0037329 A1 Feb. 14, 2008

Related U.S. Application Data

(63) Continuation of application No. PCT/JP2005/005748, filed on Mar. 28, 2005.

(51) Int. Cl.
*G11C 16/28* (2006.01)
*G11C 16/06* (2006.01)

(52) U.S. Cl. .................. 365/185.2; 365/210.1

(58) Field of Classification Search ............ 365/185.24, 365/185.04, 185.17, 185.2, 185.09, 210.1, 365/210.15, 185.03
See application file for complete search history.

(56) References Cited

U.S. PATENT DOCUMENTS

| | | | | |
|---|---|---|---|---|
| 5,448,518 A | | 9/1995 | Jinbo | |
| 6,643,177 B1 * | | 11/2003 | Le et al. | 365/185.2 |
| 6,690,602 B1 * | | 2/2004 | Le et al. | 365/185.33 |
| 6,700,815 B2 * | | 3/2004 | Le et al. | 365/185.03 |
| 7,324,374 B2 * | | 1/2008 | Shieh et al. | 365/185.03 |
| 2003/0202411 A1 | | 10/2003 | Yamada | |
| 2004/0160828 A1 | | 8/2004 | Iwata et al. | |
| 2006/0062054 A1 * | | 3/2006 | Hamilton et al. | 365/189.07 |

FOREIGN PATENT DOCUMENTS

| | | |
|---|---|---|
| JP | 7-57487 A | 3/1995 |
| JP | 2003-323796 A | 11/2003 |
| JP | 2004-247436 A | 9/2004 |

\* cited by examiner

*Primary Examiner*—VanThu Nguyen
*Assistant Examiner*—Douglas King
(74) *Attorney, Agent, or Firm*—Arent Fox LLP

(57) ABSTRACT

A nonvolatile semiconductor memory that improved a read rate. In a memory cell array in which each memory cell includes two storage areas, thresholds of outer storage areas of two memory cells which are symmetrical with respect to two adjacent bit lines are set so as to create a pair relation between them. A word line selection circuit applies read voltage to a word line to which the two memory cells to be read are connected. A bit line selection circuit applies ground voltage to two bit lines just outside the two memory cells and applies predetermined read voltage to two bit lines inside the two memory cells. A read conversion circuit compares drain currents which run through the two memory cells activated by the word line selection circuit and the bit line selection circuit, and converts the drain currents into data.

10 Claims, 7 Drawing Sheets

NONVOLATILE SEMICONDUCTOR MEMORY, METHOD FOR READING THE SAME, AND MICROPROCESSOR

This application is a continuing application, filed under 35 U.S.C. §111(a), of International Application PCT/JP2005/005748, filed on Mar. 28, 2005.

BACKGROUND OF THE INVENTION (1) Field of the Invention

This invention relates to a nonvolatile semiconductor memory, a method for reading such a nonvolatile semiconductor memory, and a microprocessor and, more particularly, to an electrically erasable programmable virtual ground nonvolatile semiconductor memory, a method for reading such a nonvolatile semiconductor memory, and a microprocessor including such a nonvolatile semiconductor memory.

(2) Description of the Related Art

Conventionally, floating gate virtual ground nonvolatile semiconductor memories have widely been used as electrically erasable programmable nonvolatile semiconductor memories.

FIG. 7 is a view showing the structure of a conventional floating gate virtual ground AND-type nonvolatile semiconductor memory.

A memory cell array of a floating gate virtual ground nonvolatile semiconductor memory includes floating gate nonvolatile memory cells (memory cells) $m_{11}$, $m_{12}$, etc. arranged like a matrix, word lines $WL_1$, $WL_2$, etc. arranged in the direction of each row of memory cells, and bit lines $BL_1$, $BL_2$, etc. arranged in the direction of each column of memory cells. Each of the word lines $WL_1$, $WL_2$, etc. is connected to gate electrodes of memory cells arranged in a row. The bit lines $BL_1$, $BL_2$, etc. are connected to a read conversion circuit $SA_0$ which is used for reading out data and which is also connected to a reference cell $m_R$.

In a data read process, a threshold of a storage area in a memory cell is read out, the threshold is compared with a reference value, and the threshold is converted into data according to whether the threshold is higher or lower than the reference value. When the threshold is read out, voltages $V_{WL}$ and $V_{BL}$ are applied to a word line and a bit line, respectively, corresponding to a selected address. For example, to read out a threshold of the memory cell $m_{24}$ connected to the word line $WL_2$ and the bit lines $BL_4$ and $BL_5$, the voltage $V_{WL}$ is applied to the word line $WL_2$ and the voltage $V_{BL}$ is applied to the bit line $BL_4$. The bit line $BL_5$ which is adjacent to the bit line $BL_4$ with the memory cell $m_{24}$ between is connected to GND. As a result, a drain current $I_{d0}$ varies according to the number of electrons stored in a floating gate of the memory cell $m_{24}$. Similarly, voltages $V_{WL}$ and $V_{BL}$ are applied to a word line $WL_R$ and a bit line $BL_R$, respectively, of the reference cell $m_R$ and GND is applied to an opposite source line. On the basis of whether the drain current $I_{d0}$ which runs through the memory cell $m_{24}$ is more or less powerful than a drain current $I_{dR}$ which runs through the reference cell $m_R$, the read conversion circuit $SA_0$ determines which of "0" and "1" it should output, and outputs data output $DO_0$.

A virtual ground semiconductor memory in which two different memory cells between which a non-selected memory cell is are read at the same time is proposed (see, for example, Japanese Patent Laid-Open Publication No. Hei 7-57487 (Paragraphs [0009]-[0011] and FIG. 1)). With this virtual ground semiconductor memory, a leakage current that runs through the non-selected memory cell is decreased by performing such reading. As a result, power consumption decreases.

With floating gate virtual ground nonvolatile semiconductor memories, however, it is difficult to perform high-speed reading.

With the conventional floating gate virtual ground nonvolatile semiconductor memory, the read conversion circuit $SA_0$ determines on the basis of a comparison between the drain current which runs through the memory cell and the drain which runs through the reference cell whether output is "0" or "1". Therefore, unless there is a sufficiently great difference between the drain current which runs through the memory cell and the drain current which runs through the reference cell, the read conversion circuit $SA_0$ cannot make a determination. To make a determination, these drain currents should be amplified. However, time necessary for the stabilization of a value is proportional to an amplification factor, resulting in a slow read rate. Furthermore, the drain current flows through the memory cell and to GND. However, a current $I_{dleak}$ also flows to a non-selected memory cell. Accordingly, with the conventional floating gate virtual ground nonvolatile semiconductor memory it is difficult to perform high-speed reading. In addition, the reference cell for generating the drain current for comparison is essential to determination made by the read conversion circuit $SA_0$. Accordingly, memory cell array area for the reference cell is necessary.

On the other hand, if two bit lines "bit" and "bit/" are used and currents which run through the bit lines are compared, then a reference cell is unnecessary. If two different memory cells between which a non-selected memory cell is used, column lines outside the two different memory cells are connected to GND and bit lines inside the two different memory cells are used as "bit" and "bit/", accordingly, currents do not flow to the outside of the column lines connected to GND and an improvement in a read rate can be expected. However, if this method is applied to the conventional floating gate virtual ground nonvolatile semiconductor memory, two memory cells are necessary for storing one bit. As a result, memory cell array area increases.

SUMMARY OF THE INVENTION

The present invention was made under the background circumstances described above. An object of the present invention is to provide a nonvolatile semiconductor memory capable of improving a read rate without increasing memory cell array area and a method for reading such a nonvolatile semiconductor memory.

In order to achieve the above object, an electrically erasable programmable virtual ground nonvolatile semiconductor memory is provided. This nonvolatile semiconductor memory comprises a memory cell array in which a gate, a source, and a drain of each nonvolatile memory cell including two storage areas are connected to a row line, a column line, and a column line respectively; a row selection circuit for applying, in the case of thresholds of outer storage areas from adjacent column lines of two nonvolatile memory cells in the memory cell array which are symmetrical with respect to the adjacent column lines and each of which includes the two storage areas being set in advance so as to create a pair relation, predetermined read voltage to a row line to which the two nonvolatile memory cells are connected for the purpose of reading the outer storage areas of the two nonvolatile memory cells to be read; a column selection circuit for applying, in the case of the thresholds of the outer storage areas from the adjacent column lines of the two nonvolatile memory cells in the memory cell array which are symmetrical with respect to the adjacent column lines and each of which includes the two storage areas being set in advance so as to create the pair relation, ground voltage to two column lines just outside the two nonvolatile memory cells to be read and applying predetermined read voltage to two column lines inside the two nonvolatile memory cells to be read for the purpose of reading the outer storage areas of the two nonvolatile memory cells to be read; and a read conversion circuit for comparing drain currents which run through the two nonvolatile memory cells and for converting the drain currents into data on the basis that the pair relation is created between the thresholds of the outer storage areas included in the two nonvolatile memory cells.

In addition, in order to achieve the above object, a method for reading an electrically erasable programmable virtual ground nonvolatile semiconductor memory is provided. This method comprises the steps of performing setting in advance so as to create a pair relation between thresholds of outer storage areas from adjacent column lines of two nonvolatile memory cells which are symmetrical with respect to the adjacent column lines and each of which includes two storage areas in a memory cell array in which a gate, a source, and a drain of each nonvolatile memory cell including the two storage areas are connected to a row line, a column line, and a column line respectively; the applying, by a row selection circuit, of predetermined read voltage to a row line to which the two nonvolatile memory cells to be read are connected for the purpose of reading the outer storage areas of the two nonvolatile memory cells; the applying, by a column selection circuit, of ground voltage to two column lines just outside the two nonvolatile memory cells to be read and the applying, by the column selection circuit, of predetermined read voltage to two column lines inside the two nonvolatile memory cells to be read; and the comparing, by a read conversion circuit, of drain currents which run through the two nonvolatile memory cells and the converting, by the read conversion circuit, of the drain currents into data on the basis that the thresholds of the outer storage areas of the two nonvolatile memory cells activated by the row selection circuit and the column selection circuit are set so as to create the pair relation.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
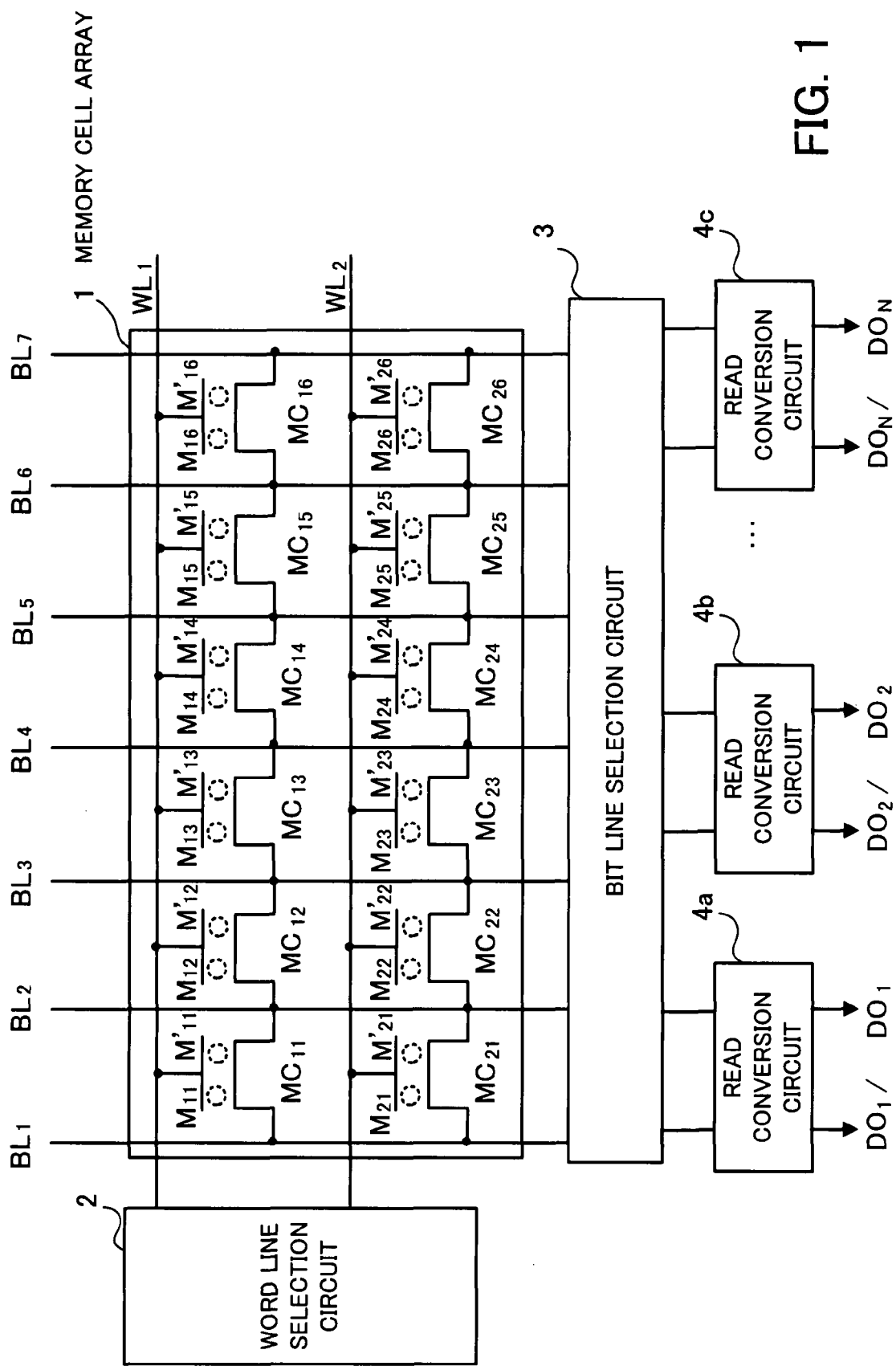
FIG. 1 is a block diagram showing the structure of a nonvolatile semiconductor memory according to an embodiment of the present invention.

Embodiments of the present invention will now be described with reference to the drawings. FIG. 1 is a block diagram showing the structure of a nonvolatile semiconductor memory according to an embodiment of the present invention.

A nonvolatile semiconductor memory according to an embodiment of the present invention comprises a memory cell array 1 in which nonvolatile memory cells each having two storage areas are arranged in rows and columns, in which each gate is connected to a word line (row line), and in which each source/drain is connected to a bit line (column line), a word line selection circuit 2 for selecting a word line connected to two memory cells to be read and for activating the two memory cells to be read, a bit line selection circuit 3 for selecting bit lines which are connected to the two memory cells to be read and which are just outside the two memory cells to be read and bit lines which are connected to the two memory cells to be read and which are inside the two memory cells to be read and for activating the two memory cells to be read, and read conversion circuits $4a$, $4b$, $4c$, etc. for comparing drain currents which run through the two memory cells activated by the word line selection circuit 2 and the bit line selection circuit 3 and for converting the drain currents into data.

Electrically erasable programmable memory cells $MC_{11}$, $MC_{12}$, etc. each having two storage areas are arranged in rows and columns in the memory cell array 1. Drains and sources of memory cells adjacent to each other in a column direction are connected in series by bit lines. A gate of each memory cell is connected to one of word lines arranged in a row direction. For example, the memory cells $MC_{11}$ has two storage areas $M_{11}$, and $M'_{11}$. A gate of the memory cell $MC_{11}$ is connected to a word line $WL_1$ and a source and a drain of the memory cell $MC_{11}$ are connected to the bit lines $BL_1$ and $BL_2$. To store predetermined 1-bit data in the memory cell array 1 having the above structure, thresholds of outer storage areas of two memory cells which are symmetrical with respect to two adjacent bit lines are set so as to create a pair relation between them. That is to say, if the threshold of one outer storage area is in a high state, then the threshold of the other outer storage area is set to a low state. For example, thresholds of the outer storage areas $M_{11}$ and $M'_{13}$ included in the memory cells $MC_{11}$ and $MC_{13}$, respectively, which are symmetrical with respect to the two adjacent bit lines $BL_2$ and $BL_3$ are set so as to create the pair relation between them. If the threshold of the outer storage area $M_{11}$ included in the memory cell $MC_{11}$ is in the high state, then the threshold of the outer storage area $M'_{13}$ included in the memory cell $MC_{13}$ is in the low state. Conversely, if the threshold of the outer storage area $M_{11}$ included in the memory cell $MC_{11}$ is in the low state, then the threshold of the outer storage area $M'_{13}$ included in the memory cell $MC_{13}$ is in the high state. When a threshold is in the high state, a large number of electrons are stored in a storage area. Conversely, when a threshold is in the low state, a small number of electrons are stored in a storage area. If the thresholds of the outer storage areas are set in this way so as to create the pair relation between them, that is to say, if the thresholds of the outer storage areas are set to the high and low states, it is easy to determine by comparison which threshold is in the high state. It is desirable that each memory cell arranged in the memory cell array 1 should be a non-floating gate memory cell. This is because, for example, a non-floating gate memory cell which is known as "MONOS" stores electrons with the trap of Oxide-Nitride-Oxide film, and it has two storage place (at near the drain and at near the source); furthermore, when reading one of the storage place the other does not affect the place being read.

To read the outer storage areas of the two memory cells to be read the thresholds of which are set so as to create the pair relation, the word line selection circuit 2 selects a word line connected to the two memory cells to be read corresponding to a memory address at which reading is requested, and applies predetermined read voltage.

To read the outer storage areas of the two memory cells to be read the thresholds of which are set so as to create the pair relation, the bit line selection circuit 3 applies ground voltage to the bit lines that are connected to the two memory cells corresponding to the memory address at which reading is requested and that are just outside the two memory cells, and applies predetermined read voltage to the bit lines inside the two memory cells. By doing so, an currents run through the two memory cells selected. In addition, the bit line selection circuit 3 connects the two bit lines to which the predetermined read voltage is applied to a corresponding read conversion circuit.

For example, it is assumed that the outer storage areas $M_{11}$ and $M'_{13}$ included in the memory cells $MC_{11}$ and $MC_{13}$, respectively, which are symmetrical with respect to the two adjacent bit lines $BL_2$ and $BL_3$ are read. The word line selection circuit 2 applies the predetermined read voltage to the word line $WL_1$. The bit line selection circuit 3 applies the ground voltage to the bit line $BL_1$ and $BL_4$ just outside the memory cells $MC_{11}$ and $MC_{13}$ respectively and applies predetermined read voltage to the bit lines $BL_2$ and $BL_3$ inside the memory cells $MC_{11}$ and $MC_{13}$. As a result, the memory cells $MC_{11}$ and $MC_{13}$ are activated and drain currents flow according to the number of electrons (threshold) stored in the outer storage areas $M_{11}$ and $M'_{13}$ included in the memory cells $MC_{11}$ and $MC_{13}$ respectively.

Each of the read conversion circuits 4a, 4b, 4c, etc. compares drain currents which flow according to the thresholds of the outer storage areas of the two memory cells activated by the word line selection circuit 2 and the bit line selection circuit 3, and converts them into data. The data is outputted as predetermined bit data and bit data obtained by inverting the predetermined bit data. For example, the read conversion circuit 4a outputs the bit data $DO_1$ and the inverted bit data $DO_1$/(hereinafter inverted bit data will be represented by adding "/" to a data name). The thresholds of the outer storage areas of two memory cells are set so as to create the pair relation between them. Each of the read conversion circuits 4a, 4b, 4c, etc. compares drain currents that run through the two memory cells and that are inputted via two bit lines connected to the two memory cells. Accordingly, a reference cell is unnecessary. In addition, the ground voltage is applied to bit lines just outside the two memory cells and the predetermined read voltage is applied to bit lines inside the two memory cells. As a result, currents do not flow to the outside of the bit lines just outside the two memory cells. This enables high-speed data conversion. Each of the read conversion circuits 4a, 4b, 4c, etc. includes, for example, a differential amplifier for detecting the difference between currents.

The operation of and a method for reading the nonvolatile semiconductor memory having the above structure will be described.

Figure 2:
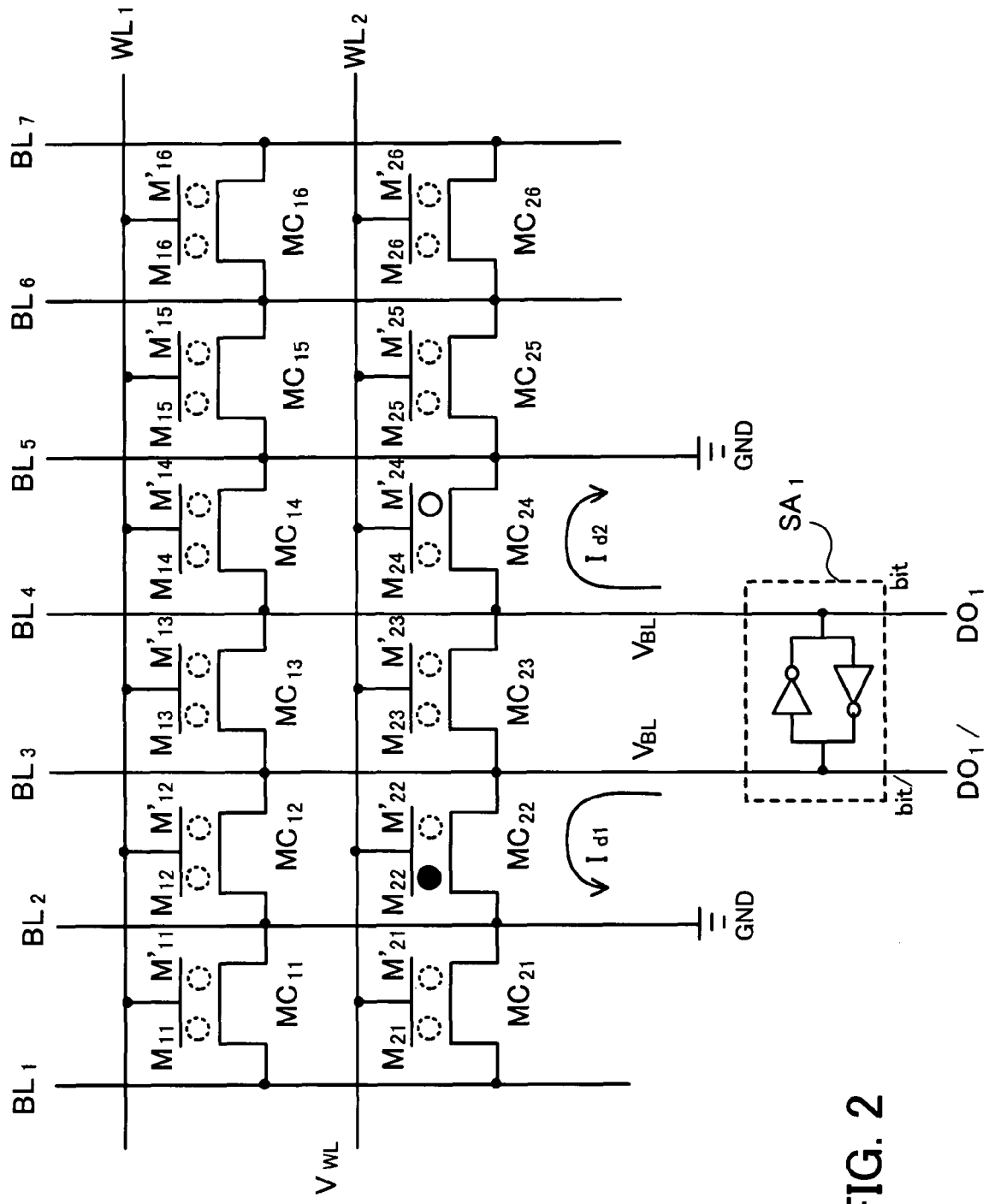
FIG. 2 is a view showing data read operation according to an embodiment of the present invention.

FIG. 2 is a view showing data read operation according to an embodiment of the present invention. In FIG. 2, each storage area is marked with a circle completely covered in black, a circle, or a circle represented by a dotted line. A circle completely covered in black indicates that a large number of electrons are stored in a corresponding storage area. A circle indicates that a small number of electrons are stored in a corresponding storage area. A circle represented by a dotted line indicates that a corresponding storage area has no special relation to the descriptions. A large or small number of electrons are stored in a storage area marked with a circle represented by a dotted line. In the following descriptions it is assumed that each of read conversion circuits 4a, 4b, 4c, etc. includes a differential amplifier $SA_1$ for comparing drain currents inputted from two bit lines and for determining a signal value on the basis of the difference between the drain currents.

Of memory cells included in this memory cell array, the thresholds of two outer storage areas from adjacent bit lines of the four storage areas of two memory cells which are symmetrical with respect to the adjacent bit lines are set so as to create the pair relation between them. In the example shown in FIG. 2, the thresholds of outer storage areas included in two memory cells which are symmetrical with respect to adjacent bit lines and which are just outside the adjacent bit lines are set so as to create the pair relation between them. For example, the thresholds of outer storage areas $M_{12}$ and $M'_{14}$ included in memory cells $MC_{12}$ and $MC_{14}$, respectively, which are symmetrical with respect to adjacent bit lines $BL_3$ and $BL_4$ are set so as to create the pair relation between them. Similarly, the thresholds of outer storage areas $M_{22}$ and $M'_{24}$ included in memory cells $MC_{22}$ and $MC_{24}$, respectively, which are symmetrical with respect to the adjacent bit lines $BL_3$ and $BL_4$ are set so as to create the pair relation between them. Each memory cell and another memory cell are symmetrical with respect to other adjacent bit lines. Accordingly, the thresholds of the other storage area included in each memory cell and an outer storage area included in another memory cell are set so as to create the pair relation between them. For example, the memory cell $MC_{24}$ and a memory cell $MC_{26}$ are symmetrical with respect to bit lines $BL_5$ and $BL_6$. Accordingly, the thresholds of the other storage area $M_{24}$ included in the memory cell $MC_{24}$ and an outer storage area $M'_{26}$ included in the memory cell $MC_{26}$ are set so as to create the pair relation between them. Bit lines to be selected depends on an address. By changing an address, the thresholds of all storage areas between which the pair relation exists can be read out. Therefore, the area of the memory cell array is the same as that of a memory cell array in which one bit is read out from one memory cell. Therefore, there is no need to increase the area of the entire memory cell array.

When a threshold is read out, a word line selection circuit (not shown) selects a word line to which two memory cells corresponding to a designated address are connected, and applies the predetermined read voltage $V_{WL}$. A bit line selection circuit (not shown) applies the ground voltage (GND) to bit lines just outside the two memory cells corresponding to the designated address and applies the predetermined read voltage $V_{BL}$ to bit lines which are inside the two memory cells and to which the two memory cells are connected. Drain currents which run through the two memory cells activated by the word line selection circuit and the bit line selection circuit are inputted to the differential amplifier $SA_1$ via the two bit lines selected. The differential amplifier $SA_1$ compares the drain currents inputted via the two bit lines and converts them into data.

In the example shown in FIG. 2, the thresholds of the outer storage areas $M_{22}$ and $M'_{24}$ included in the memory cells $MC_{22}$ and $MC_{24}$, respectively, which are symmetrical with respect to the bit lines $BL_3$ and $BL_4$ are set so as to create the pair relation between them. In FIG. 2, the threshold of the storage area $M_{22}$ included in the memory cell $MC_{22}$ is set to the high state (circle completely covered in black) and the threshold of the storage area $M'_{24}$ included in the memory cell $MC_{24}$ is set to the low state (circle).

When reading is performed, the word line selection circuit selects a word line $WL_2$ to which the two memory cells $MC_{22}$ and $MC_{24}$ are connected according to an address designated, and applies the read voltage $V_{WL}$. The bit line selection circuit applies GND to a bit line $BL_2$ and the bit line $BL_5$ which are just outside the two memory cells $MC_{22}$ and $MC_{24}$ and to which the two memory cells $MC_{22}$ and $MC_{24}$ are connected, and applies the read voltage $V_{BL}$ to the bit lines $BL_3$ and $BL_4$ which are inside the two memory cells $MC_{22}$ and $MC_{24}$. The bit lines $BL_3$ and $BL_4$ are connected to the differential amplifier $SA_1$. As a result, a drain current $I_{d1}$ runs through the memory cell $MC_{22}$ according to the state of electrons stored in the storage area $M_{22}$, and a drain current $I_{d2}$ runs through the memory cell $MC_{24}$ according to the state of electrons stored in the storage area $M'_{24}$. In this case, the threshold of the storage area $M_{22}$ included in the memory cell $MC_{22}$ is set to the high state and the threshold of the storage area $M'_{24}$ included in the memory cell $MC_{24}$ is set to the low state. The drain currents $I_{d1}$ and $I_{d2}$ are inputted to the differential amplifier $SA_1$ which makes data conversion. The drain current $I_{d2}$ which flows through the storage area $M'_{24}$ is more powerful than the drain current $I_{d1}$ which flows through the storage area $M_{22}$. As a result, the differential amplifier $SA_1$ compares the drain currents $I_{d1}$ and $I_{d2}$, outputs $DO_1=0$ as an output bit (bit), and outputs $DO_1/=1$ as an inverted output bit (bit/). An inverted output bit may be omitted.

In the above embodiment, the drain current $I_{d1}$ does not flow to the memory cell $MC_{21}$ outside the memory cell $MC_{22}$ and the drain current $I_{d2}$ does not flow to the memory cell $MC_{25}$ outside the memory cell $MC_{24}$. As a result, a read rate can be improved. In addition, the potential of the bit line $BL_3$ and the potential of the bit line $BL_4$ are $V_{BL}$ and are the same. Accordingly, no current runs through a memory cell $MC_{23}$. Furthermore, both of storage areas included in each memory cell can be read by changing a read address. Therefore, improving a read rate does not lead to an increase in the area of the memory cell array.

Data stored in the other memory cells can be read out by the same procedure.

Figure 3:
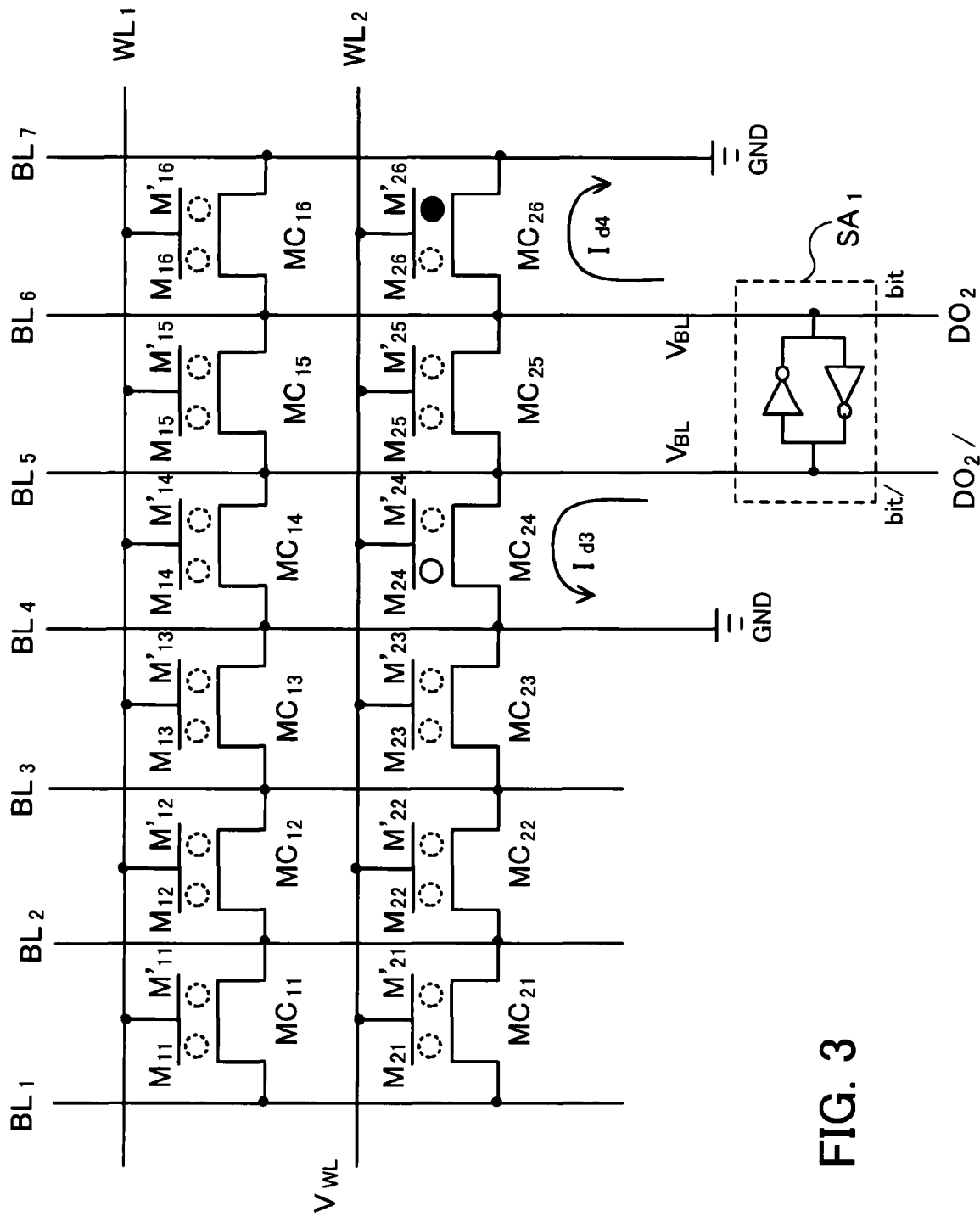
FIG. 3 is a view showing the operation of reading out data from another address, according to the embodiment of the present invention.

FIG. 3 is a view showing the operation of reading out data from another address, according to the embodiment of the present invention. Components in FIG. 3 that are the same as those shown in FIG. 2 are marked with the same symbols. In FIG. 3, the memory cells $MC_{24}$ and $MC_{26}$ are symmetrical with respect to the adjacent bit lines $BL_5$ and $BL_6$. Accordingly, the thresholds of the other storage area $M_{24}$ included in the memory cell $MC_{24}$ and the outer storage area $M'_{26}$ included in the memory cell $MC_{26}$ are set by address designation so as to create the pair relation between them. The storage area $M_{24}$ included in the memory cell $MC_{24}$ is an outer storage area from the adjacent bit lines $BL_5$ and $BL_6$. In FIG. 3, the threshold of the storage area $M_{24}$ included in the memory cell $MC_{24}$ is set in advance to the low state (circle) and the threshold of the storage area $M'_{26}$ included in the memory cell $MC_{26}$ is set in advance to the high state (circle completely covered in black).

In this case, the same procedure that is shown in FIG. 2 is practiced. That is to say, the read voltage $V_{WL}$ is applied to the word line $WL_2$ to which the two memory cells $MC_{24}$ and $MC_{26}$ to be read selected by an address are connected. The read voltage $V_{BL}$ is applied to the bit lines $BL_5$ and $BL_6$ inside the memory cells $MC_{24}$ and $MC_{26}$ and GND is applied to the bit lines $BL_4$ and $BL_7$ just outside the memory cells $MC_{24}$ and $MC_{26}$ respectively. In addition, the bit lines $BL_5$ and $BL_6$ are connected to the differential amplifier $SA_1$. As a result, a drain current $I_{d3}$ runs through the memory cell $MC_{24}$ according to the state of electrons stored in the storage area $M_{24}$, and a drain current $I_{d4}$ runs through the memory cell $MC_{26}$ according to the state of electrons stored in the storage area $M'_{26}$. The drain currents $I_{d3}$ and $I_{d4}$ are inputted to the differential amplifier $SA_1$. In this case, the drain current $I_{d3}$ which runs through the memory cell $MC_{24}$ is more powerful than the drain current $I_{d4}$ which runs through the memory cell $MC_{26}$. Accordingly, an output bit is $DO_2(bit)=1$ and an inverted output bit is $DO_2/(bit/)=0$.

Figure 4:
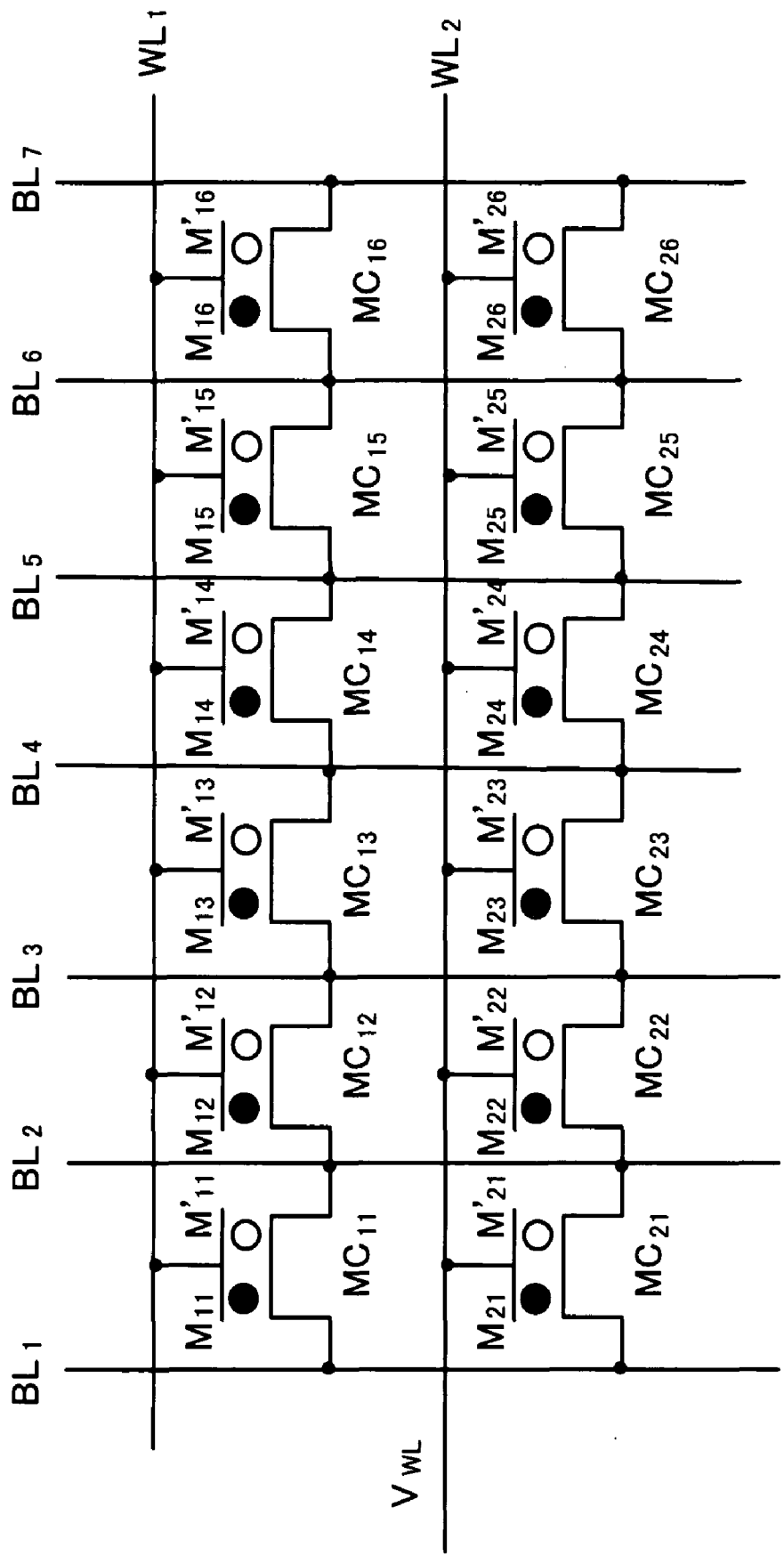
FIG. 4 is a view showing the initial state of the memory cell array included in the nonvolatile semiconductor memory according to the embodiment of the present invention.

To make the above reading possible, the thresholds of outer storage areas included in two memory cells which are symmetrical with respect to two adjacent bit lines and which are just outside the adjacent bit lines are set in advance so as to create the pair relation between them. FIG. 4 is a view showing the initial state of the memory cell array included in the nonvolatile semiconductor memory according to the embodiment of the present invention.

As shown in FIG. 4, the initial state of each memory cell is as follows. The threshold of one storage area is set to the high state (circle completely covered in black) and the threshold of the other storage area is set to the low state (circle). That is to say, a large number of electrons are stored in one storage area and a small number of electrons are stored in the other storage area. In the memory cell $MC_{23}$, for example, the threshold of the storage area $M_{23}$ is set to the high state and the threshold of the storage area $M'_{23}$ is set to the low state.

Figure 5:
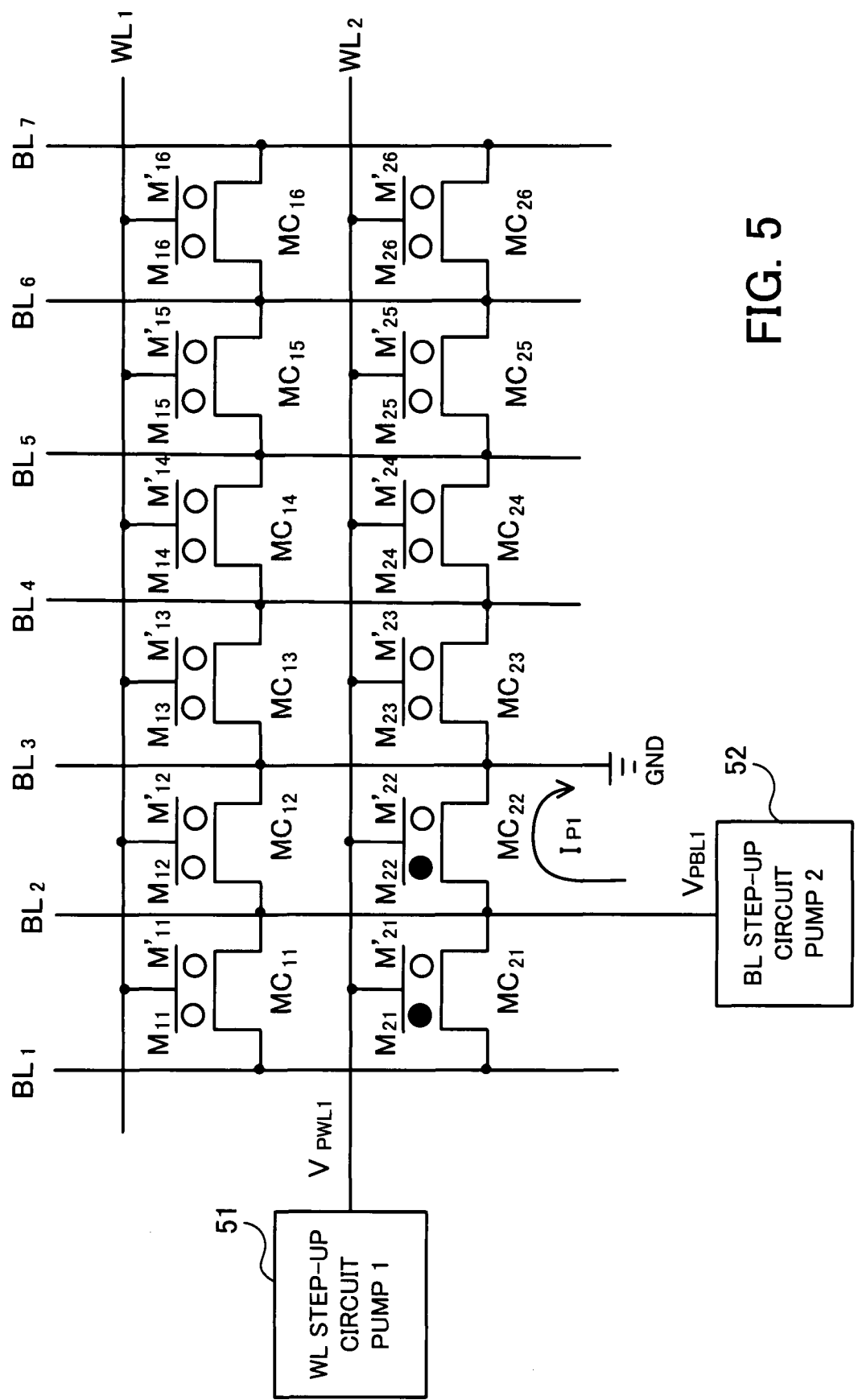
FIG. 5 is a view showing a write circuit and write operation in the nonvolatile semiconductor memory according to the embodiment of the present invention.

To create this initial state, the following method, for example, is used. First, all memory cells are erased and all storage areas are put into a state (low threshold state) in which no electron exists. One storage area of each memory cell is then written to put it into a state (high threshold state) in which many electrons exist. FIG. 5 is a view showing a write circuit and write operation in the nonvolatile semiconductor memory according to the embodiment of the present invention.

Data stored in two storage areas included in each memory cell is erased once and the two storage areas are put into a state in which no electron exists (circle). After that, the storage area $M_{21}$ included in the memory cell $MC_{21}$ is written and the storage area $M_{21}$ is put into a state in which many electrons exist (circle completely covered in black). A procedure subsequently practiced will now be described.

The storage area $M_{22}$ included in the memory cell $MC_{22}$ is then written. When the storage area $M_{22}$ is written, the word line $WL_2$ corresponding to the storage area $M_{22}$ is selected and WL voltage $V_{PWL1}$ necessary for writing data to the storage area $M_{22}$ is applied by a WL step-up circuit (pump 1) 51. The bit line $BL_2$ corresponding to the storage area $M_{22}$ is also selected, BL voltage $V_{PBL1}$ necessary for writing data to the storage area $M_{22}$ is applied by a BL step-up circuit (pump 2) 52, the bit line $BL_3$ is connected to GND, and the other bit lines are put into a floating state. As a result, a current $I_{P1}$ for writing runs through the storage area $M_{22}$ and the storage area $M_{22}$ transitions to a state in which many electrons exist. This procedure is practiced on the other memory cells in order. By doing so, the initial state shown in FIG. 4 is set.

The same procedure is used for rewriting data. For example, if an output bit outputted from the differential amplifier is rewritten from "1" (bit=1 and bit/=0) to "0" (bit=0 and bit/=1), then the same procedure is practiced. That is to say, outer storage areas included in memory cells which are symmetrical with respect to two adjacent column lines are erased once to put the outer storage areas into a state in which no electron exists (circle). After that, a storage area corresponding to "bit" is written to put the storage area into a state in which many electrons exist (circle completely covered in black). Alternatively, the following procedure may be practiced. The outer storage areas are written first to put the outer storage areas into a state in which many electrons exist (circle completely covered in black). After that, a storage area corresponding to "bit/" is erased to put the storage areas into a state in which no electron exists (circle).

Figure 6:
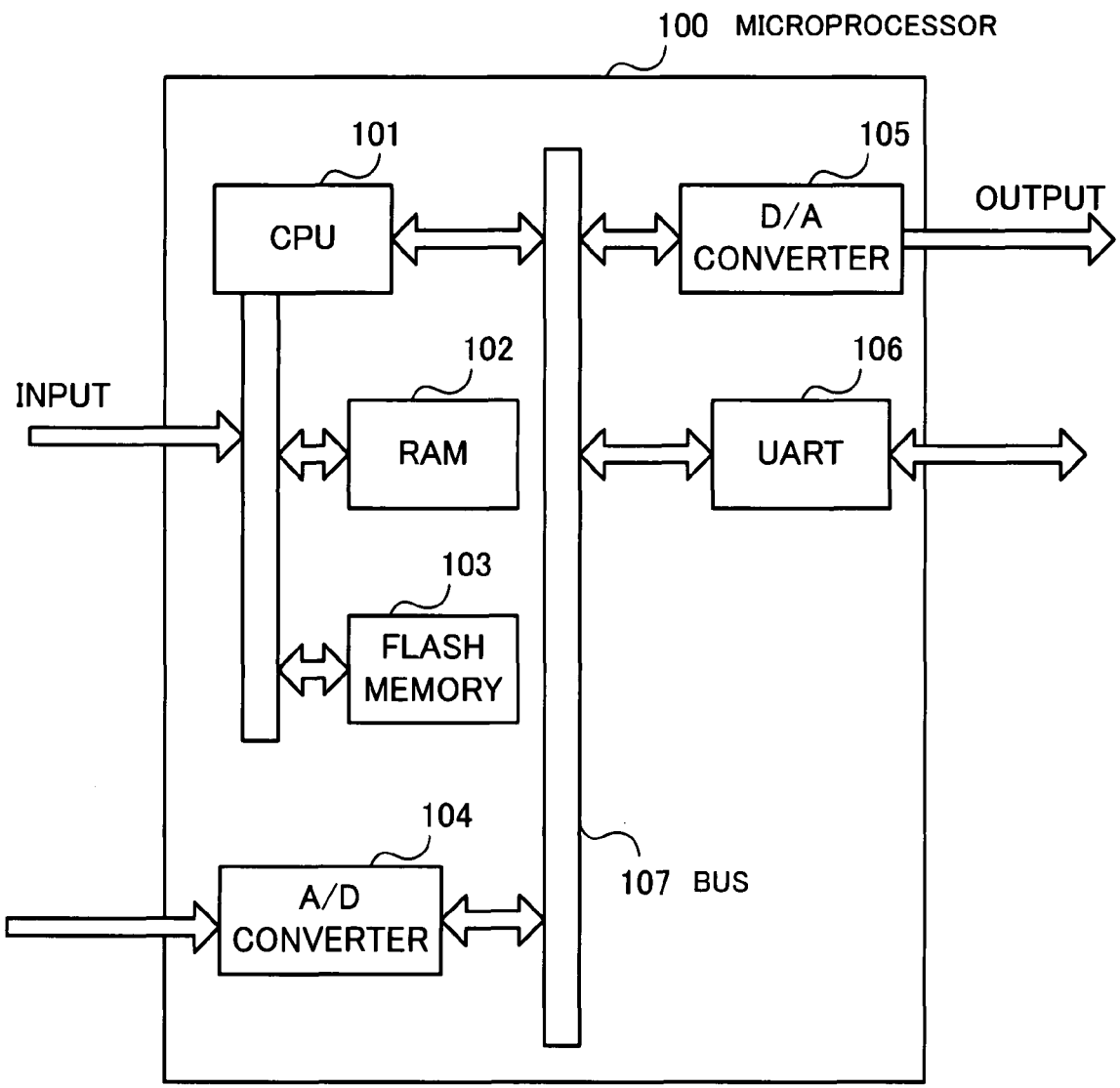
FIG. 6 is a view showing the structure of a microprocessor according to an embodiment of the present invention.
Figure 7:
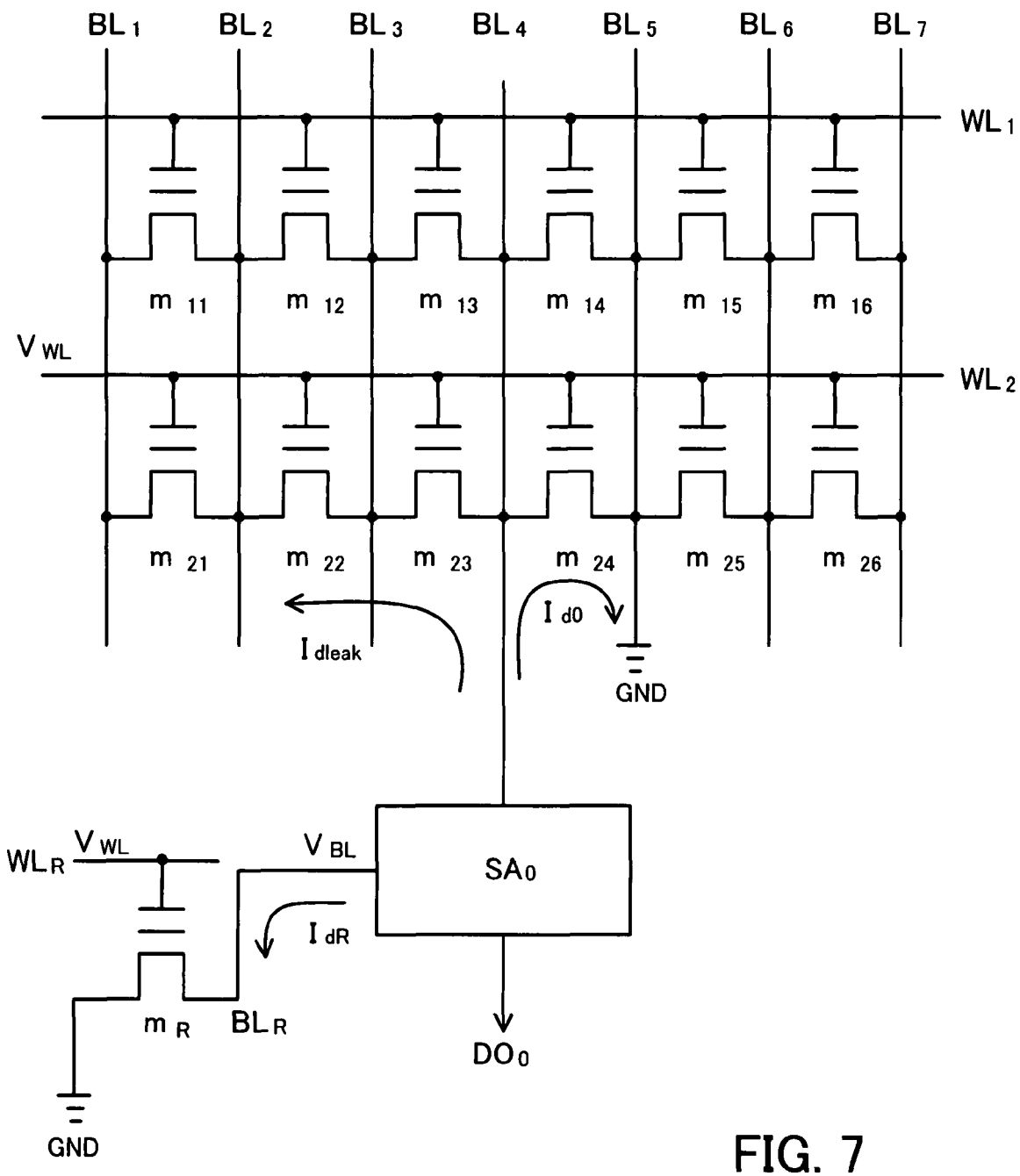
FIG. 7 is a view showing the structure of a conventional floating gate virtual ground nonvolatile semiconductor memory.

The nonvolatile semiconductor memory described above is electrically rewritable and enables high-speed access. Therefore, such a nonvolatile semiconductor memory is applied to a memory unit in a microprocessor. The nonvolatile semiconductor memory according to the present invention can also be applied to a memory unit in a microprocessor. FIG. 6 is a view showing the structure of a microprocessor according to an embodiment of the present invention.

A microprocessor 100 has the function of accepting an analog signal from the outside, performing a predetermined process, and outputting the analog signal. The whole of the microprocessor 100 is controlled by a central processing unit (CPU) 101. A random access memory (RAM) 102, a flash memory 103, an A/D converter 104, a D/A converter 105, a communication interface (UART) 106 are connected to the CPU 101 via a bus 107. The RAM 102 temporarily stores at least part of an operating system (OS) or an application program executed by the CPU 101. The flash memory 103 is the nonvolatile semiconductor memory according to the present invention and stores a program, data, and the like which are needed at the time of applying power and which must be held even at the time of power being off. The A/D converter 104 converts an analog signal inputted from the outside into a digital signal. The D/A converter 105 converts a digital signal into an analog signal and outputs the analog signal to the outside. The UART 106 outputs communication data to the outside.

With the flash memory 103 applied to the microprocessor 100 according to the embodiment of the present invention having the above structure, drain currents that run through storage areas which are included in two memory cells and the thresholds of which are set so as to create the pair relation are read out simultaneously from two bit lines and are compared. This enables high-speed reading. Furthermore, one storage area included in each memory cell is used for reading. Accordingly, the area of each memory cell is the same as that of a memory cell from which 1-bit data is read out. That is to say, the area of a memory cell array does not increase. In addition, a reference cell is unnecessary, so the area of the entire circuit can be reduced. The flash memory 103 is suitable as a memory unit in the microprocessor 100 because of these advantages. Data is read out from the flash memory 103 at a high speed, so processing speed can be increased by using the microprocessor 100 including the flash memory 103.

According to the present invention, nonvolatile memory cells each having two storage areas are used for forming a virtual ground memory cell array and the thresholds of outer storage areas included in nonvolatile memory cells which are symmetrical with respect to two adjacent column lines are set so as to create the pair relation between them. At read time, the ground voltage is applied to column lines just outside the memory cells and the predetermined read voltage is applied to column lines inside the memory cells. Drain currents that run through the outer storage areas the thresholds of which are set so as to create the pair relation are compared and are converted into data. Therefore, a reference cell is unnecessary. In addition, no current flows to the outside of the column lines to which the ground voltage is applied, so a read rate can be improved. Furthermore, there is no need to increase the area of a memory cell array.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An electrically erasable programmable virtual ground nonvolatile semiconductor memory comprising:
a memory cell array comprising nonvolatile memory cells respectively connected to row lines and column lines, each nonvolatile memory cell including two storage areas, wherein each single data bit of the memory is stored as a pair of complementary threshold states being set to outer storage areas of two nonvolatile memory cells at symmetrical locations with respect to a first pair of column lines adjacent to each other;
a row selection circuit for applying a predetermined read voltage to a row line to which the two nonvolatile memory cells are connected;
a column selection circuit for applying a ground voltage to a second pair of column lines just outside the two nonvolatile memory cells to be read simultaneously and applying another predetermined read voltage to the first pair of column lines running in a region between the two nonvolatile memory cells to be read simultaneously; and
a read conversion circuit for comparing currents which run through the two nonvolatile memory cells and for converting the currents into data on the basis that the outer storage areas of the two nonvolatile memory cells have complementary threshold states.

2. The nonvolatile semiconductor memory according to claim 1, wherein each nonvolatile memory cell is a non-floating gate memory cell.

3. The nonvolatile semiconductor memory according to claim 1, wherein one of the outer storage areas of the two nonvolatile memory cells is set to a high threshold state and the other of the outer storage areas of the two nonvolatile memory cells is set to a low threshold state.

4. The nonvolatile semiconductor memory according to claim 1, wherein the two nonvolatile memory cells are just outside the first pair of column lines.

5. The nonvolatile semiconductor memory according to claim 4, wherein:
the column selection circuit selects the first pair of column lines and applies the predetermined read voltage thereto; and
the column selection circuit selects two column lines just outside the first pair of column lines as the second pair of column lines and applies the ground voltage thereto.

6. A method for reading an electrically erasable programmable virtual ground nonvolatile semiconductor memory, the method comprising the steps of:
performing setting in advance so as to create a pair relation between thresholds of outer storage areas from adjacent column lines of two nonvolatile memory cells which are symmetrical with respect to the adjacent column lines and each of which includes two storage areas in a memory cell array, wherein each single data bit of the memory is stored as a pair of complementary threshold states being set to the outer storage areas of the two nonvolatile memory cells at symmetrical locations with respect to a first pair of column lines adjacent to each other;

the applying, by a row selection circuit, of a predetermined read voltage to a row line to which the two nonvolatile memory cells to be read are connected;

the applying, by a column selection circuit, of a ground voltage to a second pair of column lines just outside the two nonvolatile memory cells to be read simultaneously and the applying, by the column selection circuit, of another predetermined read voltage to the first pair of two column lines running in a region between the two nonvolatile memory cells to be read simultaneously; and the comparing, by a read conversion circuit, of currents which run through the two nonvolatile memory cells and the converting, by the read conversion circuit, of the currents into data on the basis that the outer storage areas of the two nonvolatile memory cells have complementary threshold states.

7. A microprocessor with an electrically erasable programmable virtual ground nonvolatile semiconductor memory, the microprocessor comprising:

a memory cell array comprising nonvolatile memory cells respectively connected to row lines and column lines, each nonvolatile memory cell including two storage areas, wherein each single data bit of the memory is stored as a pair of complementary threshold states being set to outer storage areas of two nonvolatile memory cells at symmetrical locations with respect to a first pair of column lines adjacent to each other;

a row selection circuit for applying a predetermined read voltage to a row line to which the two nonvolatile memory cells are connected;

a column selection circuit for applying a ground voltage to a second pair of column lines just outside the two nonvolatile memory cells to be read simultaneously and applying another predetermined read voltage to the first pair of column lines running in a region between the two nonvolatile memory cells to be read simultaneously; and a read conversion circuit for comparing currents which run through the two nonvolatile memory cells and for converting the currents into data on the basis that the outer storage areas of the two nonvolatile memory cells have complementary threshold states.

8. A nonvolatile semiconductor memory comprising:

a memory cell array comprising a plurality of memory cells organized into rows and columns, and row lines and column lines respectively running along the rows and columns of the memory cells, wherein:

each memory cell comprises a first storage area and a second storage area, the i-th memory cell on each row is connected to the i-th and (i+1)th column lines, where i is an integer ranging from 2 to n−2 and n is the total number of bit lines, and the first storage area of the (i−1)th memory cell and the second storage area of the (i+1)th memory cell are configured to be complementary to each other in terms of threshold states thereof to represent a single data bit of the nonvolatile semiconductor memory;

a row selection circuit to apply a first read voltage to one of the row lines to select a row of memory cells connected to that row line;

a column selection circuit to apply a ground voltage to the (i−1) th and (i+2)th column lines and a second read voltage to the i-th and (i+1)th column lines, while selecting the i-th and (i+1)th column lines so as to simultaneously read the first storage area of the (i−1)th memory cell and the second storage area of the (i+1)th memory cell on the selected row; and a read conversion circuit, coupled to the column lines selected by the column selection circuit, to convert a difference between currents flowing through the selected column lines into a data value.

9. The nonvolatile semiconductor memory according to claim 8, wherein:

the first storage area of the (i−1)th memory cell is located closer to the (i−1)th column line than to the i-th column line; and the second storage area of the (i+1)th memory cell is located closer to the (i+2)th column line than to the (i+1)th column line.

10. The nonvolatile semiconductor memory according to claim 8, wherein the complementary threshold states refer to a combination of a high threshold state meaning a larger number of electrons stored and a low threshold state meaning a smaller number of electrons stored.

* * * * *